United States Patent
Son et al.

(10) Patent No.: US 7,808,468 B2
(45) Date of Patent: Oct. 5, 2010

(54) SOURCE DRIVER FOR CONTROLLING A SLEW RATE AND A METHOD FOR CONTROLLING THE SLEW RATE

(75) Inventors: Kyoung-Mok Son, Suwon-si (KR); Soo-Cheol Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 868 days.

(21) Appl. No.: 11/445,805

(22) Filed: Jun. 3, 2006

(65) Prior Publication Data
US 2007/0008009 A1   Jan. 11, 2007

(30) Foreign Application Priority Data
Jul. 1, 2005   (KR) .................... 10-2005-0059313

(51) Int. Cl.
G09G 3/36 (2006.01)
H03K 19/094 (2006.01)
(52) U.S. Cl. .......................... 345/98; 326/87
(58) Field of Classification Search .............. 345/98
See application file for complete search history.

(56) References Cited

U.S. PATENT DOCUMENTS

| | | | |
|---|---|---|---|
| 5,099,148 A * | 3/1992 | McClure et al. | 326/86 |
| 5,223,753 A | 6/1993 | Lee et al. | |
| 5,568,084 A * | 10/1996 | McClure et al. | 327/538 |
| 5,640,122 A * | 6/1997 | McClure | 327/530 |
| 5,654,663 A * | 8/1997 | McClure et al. | 327/530 |
| 5,986,489 A * | 11/1999 | Raza et al. | 327/170 |
| 5,999,056 A * | 12/1999 | Fong | 330/278 |
| 6,166,725 A * | 12/2000 | Isami et al. | 345/209 |
| 6,392,485 B1 * | 5/2002 | Doi et al. | 330/253 |
| 6,542,004 B1 * | 4/2003 | Dunne | 326/87 |
| 6,771,126 B2 * | 8/2004 | Blankenship et al. | 330/257 |
| 2001/0043120 A1 * | 11/2001 | Murray et al. | 330/267 |
| 2004/0036670 A1 * | 2/2004 | Chung | 345/99 |
| 2005/0040889 A1 * | 2/2005 | Tsuchi | 330/255 |
| 2005/0052380 A1 * | 3/2005 | Landolt | 345/87 |
| 2006/0125759 A1 * | 6/2006 | An | 345/98 |

FOREIGN PATENT DOCUMENTS

| | | |
|---|---|---|
| CN | 1485810 | 3/2004 |
| JP | 2005-055837 | 3/1993 |
| JP | 2000-295044 | 10/2000 |
| JP | 2003-122325 | 4/2003 |
| JP | 2004-013523 | 1/2004 |
| KR | 10-1982-0002057 | 10/1982 |
| KR | 10-1994-0001816 | 3/1994 |
| KR | 1020040017157 | 2/2004 |
| KR | 1020040057491 | 7/2004 |

* cited by examiner

Primary Examiner—Richard Hjerpe
Assistant Examiner—Dorothy Webb
(74) Attorney, Agent, or Firm—F. Chau & Associates, LLC

(57) ABSTRACT

A source driver for controlling a slew rate of a liquid crystal display (LCD) and a method for controlling the slew rate is provided. The source driver includes a plurality of output buffers for driving data lines, and a bias circuit for varying a bias voltage inputted to the output buffers to control a slew rate of the output buffers.

19 Claims, 6 Drawing Sheets

Input

Output

SOURCE DRIVER FOR CONTROLLING A SLEW RATE AND A METHOD FOR CONTROLLING THE SLEW RATE

CROSS-REFERENCE TO RELATED APPLICATION

This application claims priority to Korean Patent Application No. 2005-59313, filed Jul. 1, 2005, the disclosure of which is incorporated by reference herein in its entirety.

BACKGROUND OF THE INVENTION

1. Technical Field

The present invention relates to a display device, and more particularly, to a source driver for controlling a slew rate of a liquid crystal display (LCD) and a method for controlling the slew rate.

2. Discussion of the Related Art

A liquid crystal display (LCD) is one of the most widely used flat panel displays because of its slim profile and low power consumption, etc. For example, an LCD is commonly found in a variety of electronic devices such as flat screen televisions, notebook computers, cell phones and digital cameras.

There are two main types of LCDs currently used in electronic devices; they are active matrix and passive matrix. Since an active matrix type LCD uses thin film transistors (TFTs) as switching elements for displaying moving pictures, the active matrix LCD is much brighter and sharper than passive matrix displays of the same size and generally has a quicker response time. Thus, active matrix displays are increasingly becoming the choice of laptop computer and flat screen television manufacturers.

The active matrix LCD generally includes a liquid crystal panel, a source driver, and a gate driver. The source driver generates a driving voltage to drive a plurality of data lines, and the gate driver drives a plurality of gate lines.

As the active LCD increases in size, the liquid crystal panel also increases in size. The increase in the size of the liquid crystal panel causes an increase in the number of data lines to be driven, resulting in an increased number of output buffers provided in the source driver.

To uniformly display images on the liquid crystal panel, the output buffers are required to have uniform characteristics. For example, characteristics such as slew rate, gain, phase margin, common mode rejection ratio (CMRR), power supply rejection ratio (PSRR), and an AC characteristic are generally required to be uniform. Among them, the slew rate is an important parameter for determining whether image quality is bad or good. For example, the slew rate of the output drivers must be dispersed within a predetermined distribution or the image quality of an active matrix LCD can be degraded.

Accordingly, a need exists for a source driver in which slew rates of output buffers fall within a predetermined distribution so that degradation in the image quality of the active matrix LCD can be prevented.

SUMMARY OF THE INVENTION

One aspect of the present invention provides a source driver of an LCD. The source driver includes a plurality of output buffers for driving data lines, and a bias circuit for varying a bias voltage inputted to the output buffers to control a slew rate of the output buffers.

Each of the output buffers includes: a bias current source for receiving the bias voltage to output a bias current; an input unit for receiving an analog image signal and a data line driving signal to output a differential current that is varied according to the bias current; an amplification output unit for generating a data line driving signal in response to the differential current; and a capacitor for stabilizing a frequency characteristic of the data line driving signal.

The slew rate is proportional to the bias current and inversely proportional to a capacitance of the capacitor. The bias voltage controls the bias current to adjust the slew rate.

The bias circuit includes a fusing resistor part including at least one resistor and fuse, wherein the bias voltage is controlled by a resistance of the fusing resistor part.

The resistance of the fusing resistor part is adjusted by cutting the at least one fuse by using a laser or an overcurrent supply.

When the at least one resistor and fuse are connected in series with another resistor and fuse, and when at least one of the fuses is cut, the resistance of the fusing resistor part is decreased and the bias voltage is increased.

When the at least one resistor and fuse are connected in parallel with another resistor and fuse, and when at least one of the fuses is cut, the resistance of the fusing resistor part is increased and the bias voltage is decreased.

When the fusing resistor part includes the at least one resistor and fuse connected in series and another resistor and fuse connected in parallel, the resistance of the fusing resistor part is increased or decreased by cutting the parallel connected fuse or the series connected fuse to decrease or increase the bias voltage, respectively.

The slew rate is adjusted before packaging the source driver in a chip. The slew rate of the output buffers falls within a range where an image quality of the LCD is not degraded.

Another aspect of the present invention provides a method for controlling slew rates of output buffers for a source driver. The method includes: determining a slew rate of the output buffers; determining whether the slew rate falls within a first slew rate range; and when the slew rate falls outside the first slew rate range, adjusting a bias voltage applied to the output buffers so that the slew rate falls within the first slew rate range.

The slew rate is proportional to by a bias current and inversely proportional to a capacitance of a capacitor in the output buffers. The bias voltage controls the slew rate by increasing or decreasing the bias current. When the slew rate of the output buffers falls within the first slew rate range an image quality of an LCD including the source driver is not degraded.

The bias voltage is adjusted by increasing or decreasing a resistance of a fusing resistor part in the output buffers. The resistance is increased or decreased by cutting one or more fuses in the output buffers.

In yet another aspect of the present invention, a source driver of an LCD is provided. The source driver includes a plurality of output buffers for outputting voltages to drive data lines of the LCD; and a bias circuit for supplying a variable bias voltage to the output buffers so that the output buffers have a constant slew rate range, wherein each of the output buffers comprises: a bias current source including a fifth PMOS transistor for receiving the bias voltage and supplying a bias current to first and second PMOS transistors; an input unit including the first and second PMOS transistors for respectively receiving first and second input signals for outputting a variable current corresponding to the bias current; an amplification output unit including third, fourth, sixth and seventh PMOS transistors forming a current mirror, first and second NMOS transistors forming a cascade amplifying terminal and third and fourth NMOS transistors forming a current source, the amplification output unit receiving the variable current and outputting the output voltage; and a capacitor for stabilizing a frequency characteristic of the output voltage.

The bias circuit comprises first and second NMOS transistors forming a current mirror and a fusing resistor part connected between a power supply voltage and the current mirror. The bias voltage is varied by the fusing resistor part.

BRIEF DESCRIPTION OF THE DRAWINGS

The accompanying drawings, which are included to provide a further understanding of the invention and are incorporated in and constitute a part of this application, illustrate preferred embodiment(s) of the invention and together with the description serve to explain the principles of the invention. In the drawings.

DETAILED DESCRIPTION OF PREFERRED EMBODIMENTS

Hereinafter, preferred embodiments of the present invention will be described in detail with reference to the accompanying drawings.

Figure 1:
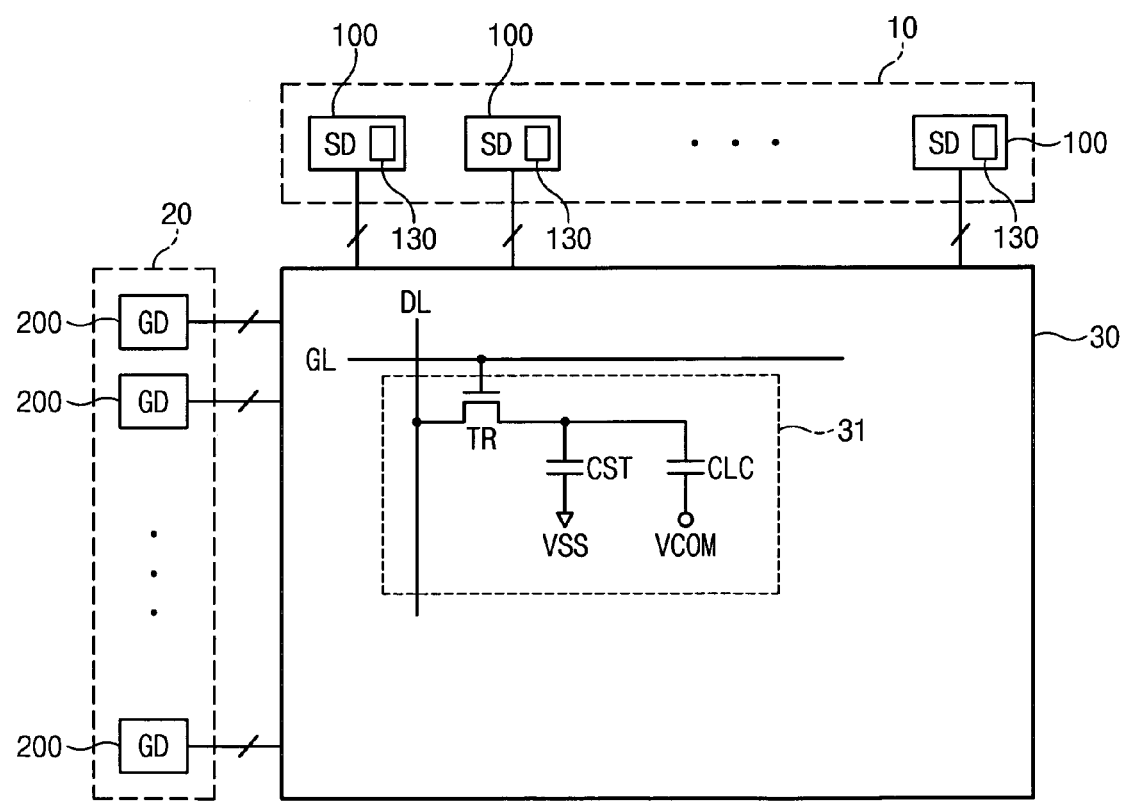
FIG. 1 is a block diagram of a liquid crystal display (LCD) according to a preferred embodiment of the present invention.

FIG. 1 is a block diagram of a liquid crystal display (LCD) according to a preferred embodiment of the present invention. Referring to FIG. 1, the LCD includes a liquid crystal panel 30, a source driver circuit (SD) 10, and a gate driver circuit (GD) 20.

The source driver circuit 10 includes a plurality of source driving units or source drivers 100 and the gate driver circuit 20 includes a plurality of gate driving units or gate drivers 200. The source driving units 100 drive data lines DL disposed at the liquid crystal panel 30. The gate driving units 200 drive gate lines GL disposed at the liquid crystal panel 30. The data line DL is also called a source line or a channel.

The liquid crystal panel 30 includes a plurality of pixels 31. Each of the pixels 31 includes a switch transistor TR, a storage capacitor CST for reducing leakage current from a liquid crystal, and a liquid crystal capacitor CLC. The switch transistor TR is turned on and off in response to a gate driving signal. A first terminal of the switch transistor TR is connected to the gate line GL and a second terminal of the switch transistor TR is connected to the data line DL. The storage capacitor CST is connected between a third terminal of the switch transistor TR and a ground voltage VSS. The liquid crystal capacitor CLC is connected between the third terminal of the switch transistor TR and a common voltage VCOM.

The source driver 100 is generally configured with a shift register for sequentially shifting digital data inputted from a timing controller (not shown), a digital to analog converter (DAC) for converting the digital data into corresponding analog voltage values, and a source driver output circuit for receiving the converted analog voltage values to drive the data lines DL of the liquid crystal panel 30. Thus, for example, when a clock signal TP instructing the source driver 100 to supply the analog voltage values to the liquid crystal panel 30 is inputted thereto, the source driver output circuit drives the data lines DL and applies image signals to the liquid crystal capacitors CLC through the turned-on thin film transistors TR.

Figure 2:
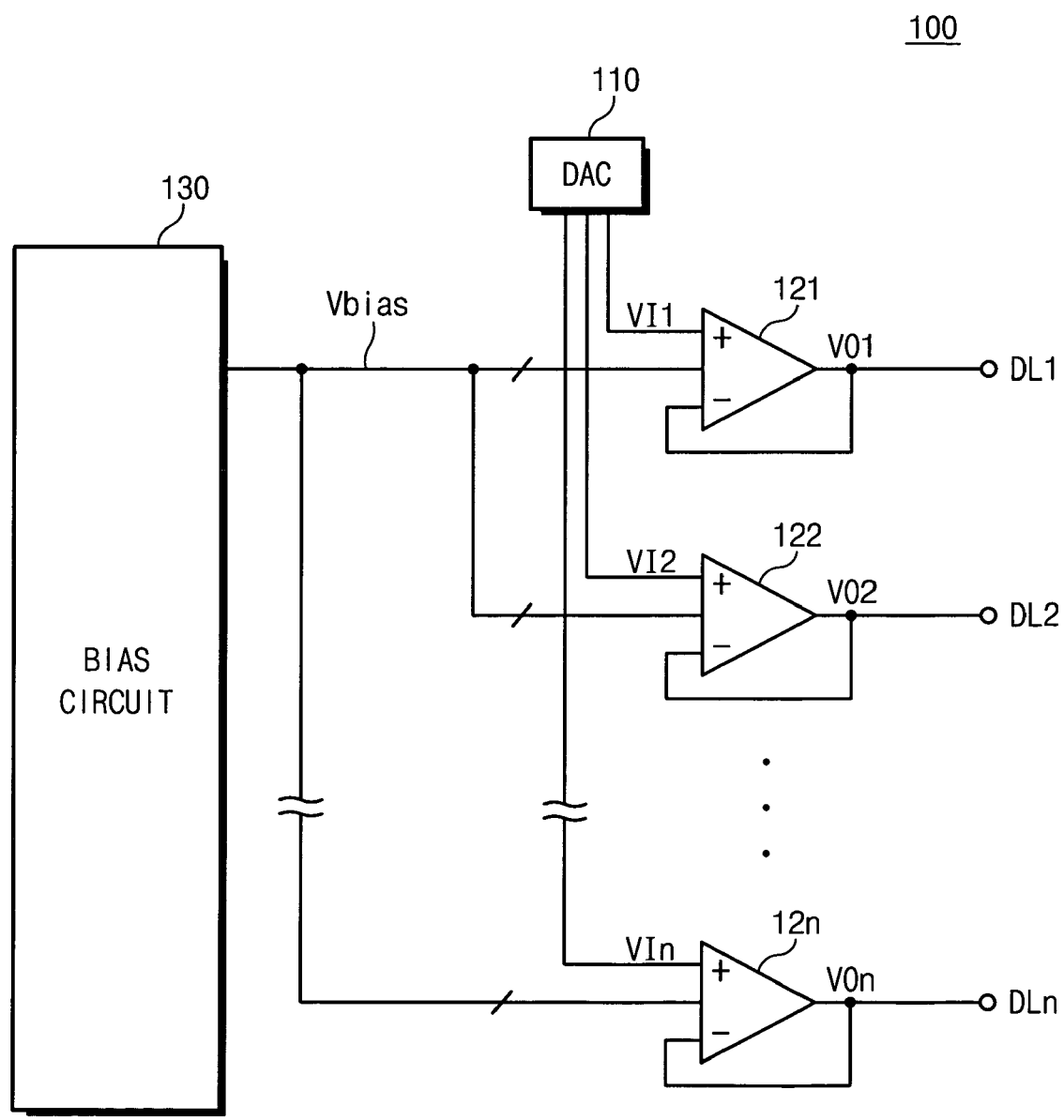
FIG. 2 is a circuit diagram of a source driver according to a preferred embodiment of the present invention.

FIG. 2 is a circuit diagram of the source driver 100 according to a preferred embodiment of the present invention. Specifically, FIG. 2 illustrates output related circuits of the source driver 100, for example, a DAC 110 and a bias circuit 130, and a plurality of output buffers 121 to 12n.

The DAC 110 converts digital image signals into analog image signals. The analog image signals outputted from the DAC 110 represent gray voltages VI1 to VIn.

The bias circuit 130 supplies bias voltages Vbias to the output buffers 121 to 12n. In this embodiment, the bias circuit 130 adjusts the bias voltages Vbias such that the output buffers 121 to 12n have a constant slew rate range.

The plurality of output buffers 121 to 12n receive the gray voltages VI1 to VIn from the DAC 110 and the bias voltages Vbias from the bias circuit 130 and output exponentially increasing voltages VO1 to VOn. The output voltages VO1 to VOn are used to drive the data lines DL1 to DLn. In this case, slew rates of the voltages VO1 to VOn output from the output buffers 121 to 12n are determined by the bias voltages Vbias applied to the output buffers 121 to 12n. Before describing the output buffers 121 to 12n and the bias circuit 130, the slew rate thereof will be defined.

Figure 3:
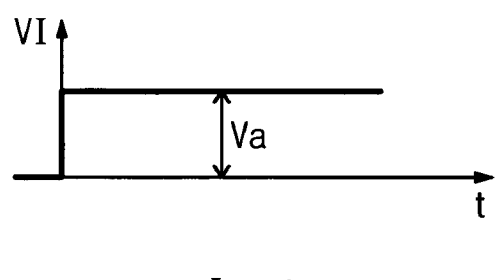
FIG. 3 is a waveform diagram for explaining a slew rate characteristic of an output buffer illustrated in FIG. 2.
Figure 3:
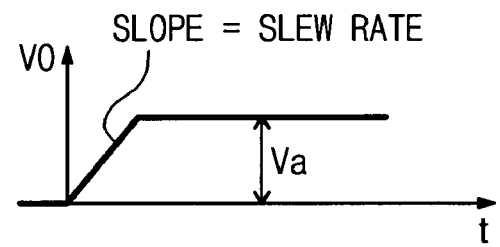

FIG. 3 is a pair of waveform diagrams for explaining the slew rate characteristic of the output buffers 121 to 12n illustrated in FIG. 2.

When a large step input VI is applied to input terminals of the output buffers 121 to 12n, the output voltage VO changes over time as illustrated by a linear slope and then is saturated to a constant voltage Va. At this point, the slope is the slew rate. If the slew rate falls outside a predetermined range and thus becomes too small or too large, a deviation occurs in an image displayed on a screen of a display device. To prevent this from happening, the bias voltage Vbias with a controlled slew rate is applied to the output buffers 121 to 12n so that the slew rate can fall within a predetermined range.

Figure 4:
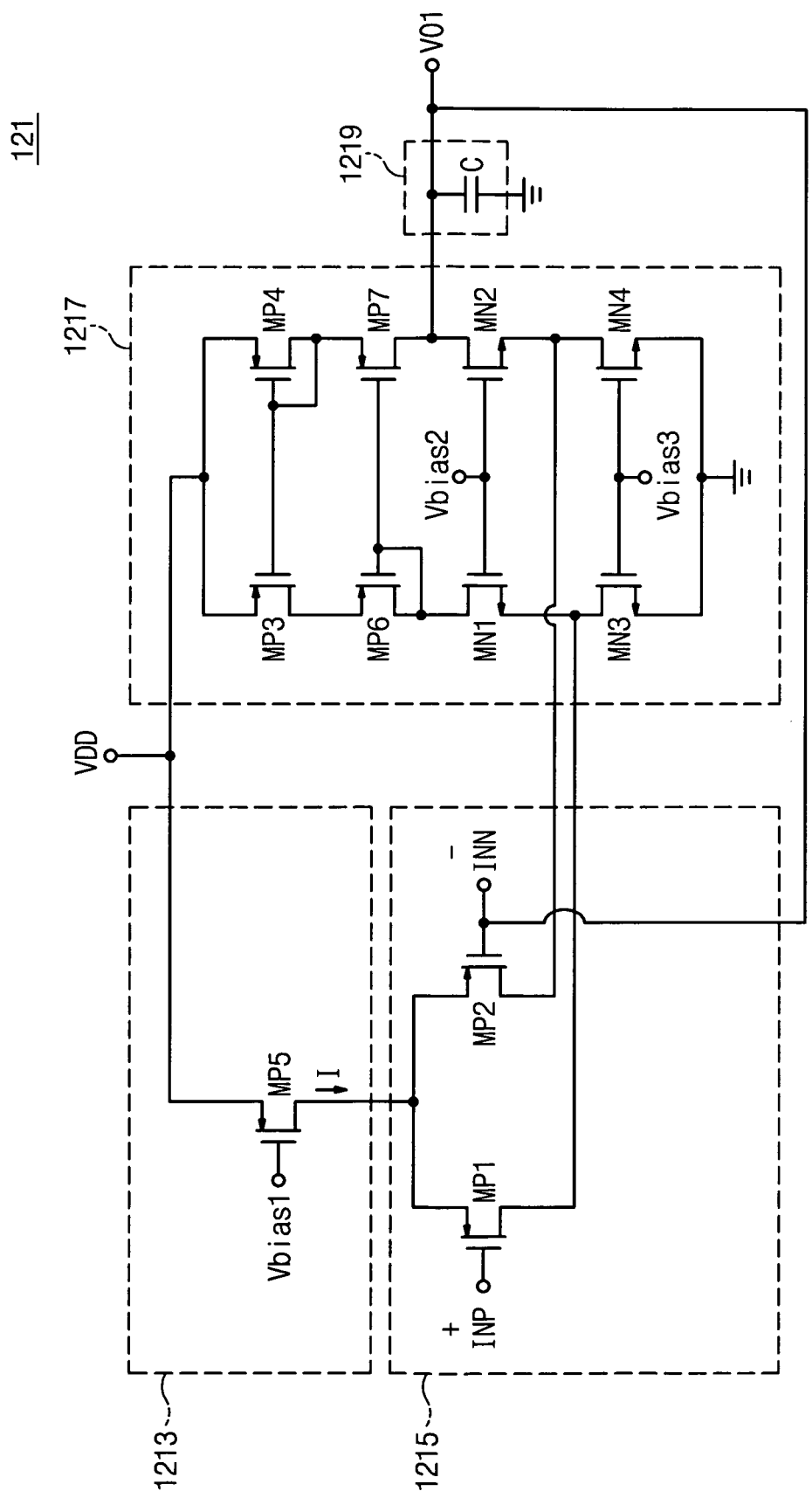
FIG. 4 is a circuit diagram of the output buffer illustrated in FIG. 2.

FIG. 4 is a circuit diagram of the output buffer 121 illustrated in FIG. 2. It is to be understood by one of ordinary skill in the art that since the output buffers 122 to 12n are the same as the output buffer 121 descriptions thereof are omitted. The output buffer 121 of FIG. 4 is a folded cascode operational amplifier and includes a bias current source 1213, an input unit 1215, an amplification output unit 1217, and a capacitor 1219.

The bias current source 1213 includes a fifth PMOS transistor MP5 configured to receive a first bias voltage Vbias1 and supply a bias current I to a differential pair of first and second PMOS transistors MP1 and MP2.

The input unit 1215 includes the first and second PMOS transistors MP1 and MP2 configured to receive first and second input signals INP and INN that are complementary to each other. The input unit 1215 has a voltage follower configuration in which the output voltage VO1 is fed back to the inverting input signal INN. The first input signal INP is an analog image signal and the second input signal INN is a data line driving signal. The input unit 1215 outputs a variable differential current corresponding to the bias current I inputted from the bias current source 1213.

The amplification output unit 1217 includes PMOS transistors MP3, MP4, MP6 and MP7 and NMOS transistors MN1 to MN4. The PMOS transistors MP3, MP4, MP6 and MP7 serve as a Wilson current mirror and increase an output resistance of the amplification output unit 1217. The first and second NMOS transistors MN1 and MN2 serve as a cascode amplifying terminal to receive a second bias voltage Vbias2 and increase gain. The third and fourth NMOS transistors MN3 and MN4 receive a third bias voltage Vbias3 and serve as a current source.

The capacitor (C) 1219 stabilizes the frequency characteristic of the output signal VO.

The slew rate of the output buffer 121 is determined by the capacitor (C) 1219 included in the output buffer 121. The slew rate of the output buffer 121 is expressed as $$SR = \frac{dvo}{dt} = \frac{I}{C} \quad (1)$$

where I represents the current flowing through the output buffer 121, and C represents the capacitance of the capacitor (C) 1219 included in the output buffer 121.

As can be seen from Eq. (1), the slew rate (SR) of the output buffer 121 is proportional to the bias current I but inversely proportional to the capacitance C of the capacitor (C) 1219 included in the output buffer 121. Therefore, the slew rate (SR) of the output buffer 121 is controlled by adjusting an amount of the bias current I. For example, when the slew rate (SR) of the output buffer 121 is lower than a required level, the amount of the bias current I is increased. On the contrary, when the slew rate (SR) of the output buffer 121 is higher than the required level, the amount of the bias current I is decreased. In this manner, the amount of the bias current I is controlled by the level of the first bias voltage Vbias1 generated from the bias circuit 130.

Figure 5:
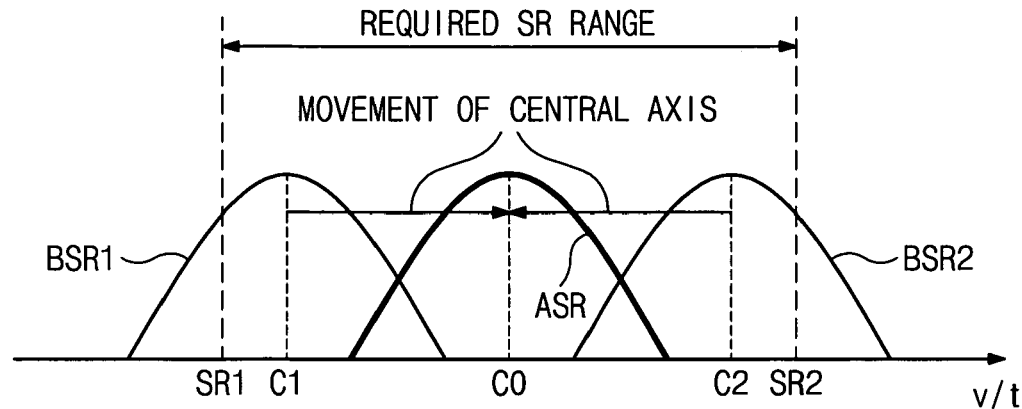
FIG. 5 is a dispersion graph showing controlled slew rates of the output buffers according to a preferred embodiment of the present invention.

FIG. 5 is a dispersion graph showing the slew rates of the output buffers controlled according to a preferred embodiment of the present invention.

In FIG. 5, BSR1 and BSR2 represent slew rate distributions of the output buffers 121 to 12n before the slew rate is controlled, and ASR represents slew rate distributions of the output buffers 121 to 12n after the slew rate is controlled. The required SR range SR1-SR2 represents a stable slew rate range in which the image quality of the output buffers 121 to 12n is not degraded. Portions of BSR1 and BSR2 fall outside the required SR range SR1-SR2. Therefore, a central axis C1 of BSR1 and a central axis C2 of BSR2 are moved to a central axis C0 by controlling the current I so that the slew rate falls within the required SR range SR1-SR2. In other words, the current I of the output buffers 121 to 12n is controlled by adjusting the level of the first bias voltage Vbias1 generated from the bias circuit 130, such that the slew rate distributions of the output buffers can fall within the required SR range SR1-SR2. It is to be understood by one of ordinary skill in that are that the required SR range SR1-SR2 can vary depending on the makers of a chip including the source driver 100.

To verify design characteristics of the source driver 100, several characteristics of the output buffers 121 to 12n are analyzed and tested to determine whether or not the image quality will be degraded. In the testing operation, a characteristic analyzing apparatus (not shown) analyzes the slew rate distributions of the output buffers 121 to 12n and confirms whether or not the slew rate distributions of the output buffers 121 to 12n fall within the required SR range SR1-SR2. If the slew rate distributions of the output buffers 121 to 12n fall outside the required SR range SR1-SR2, the characteristic analyzing apparatus controls the bias circuit 130 and changes the bias voltage Vbias applied to the output buffers 121 to 12n. Accordingly, the changed bias voltages Vbias applied to the output buffers 121 to 12n vary the current I flowing through the output buffers 121 to 12n such that the slew rate can fall within the required SR range SR1-SR2. Due to the ability to control the bias circuit 130, the output buffers 121 to 12n of the source driver 100 can have a constant slew rate distribution. Consequently, the degradation in the image quality of the display device can be prevented.

Figure 6:
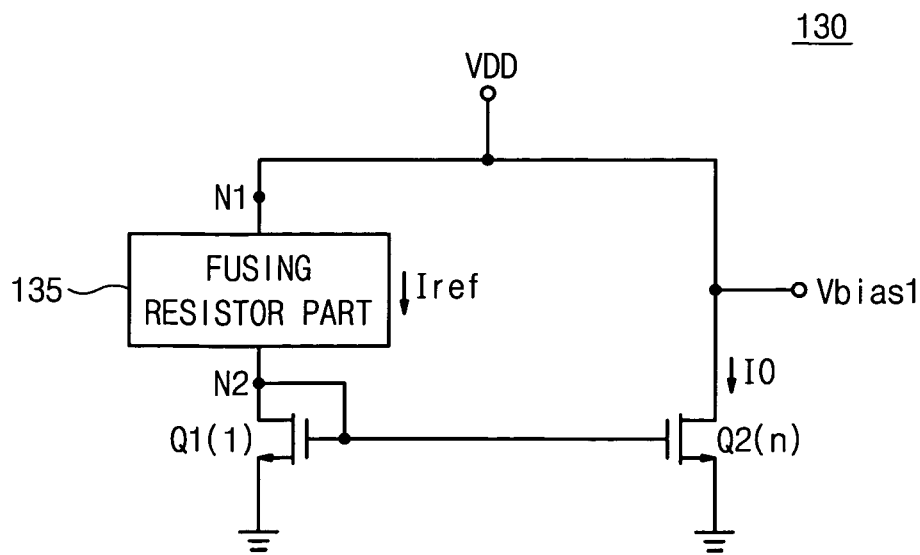
FIG. 6 is a circuit diagram of a bias circuit shown in FIG. 2.

FIG. 6 is a circuit diagram of the bias circuit 130 illustrated in FIG. 2. The bias circuit 130 of FIG. 6 is a current mirror type bias circuit. Referring to FIG. 6, the bias circuit 130 includes NMOS transistors Q1 and Q2, gates of which are connected to each other, and a fusing resistor part 135. A reference current Iref of the bias circuit 130 is determined by the fusing resistor part 135 connected between a power supply voltage VDD and a current mirror. An output current IO has a value corresponding to integer multiples (n) of the reference current Iref. The value "n" represents a size ratio of the two NMOS transistors Q1 and Q2 and indicates, for example, that a width to length ratio of the second transistor Q2 is n times a width to length ratio of the first transistor Q1. Therefore, the output current IO is changed according to the value of the fusing resistor part 135 and the output current IO controls the level of the first bias voltage Vbias1.

Figure 7:
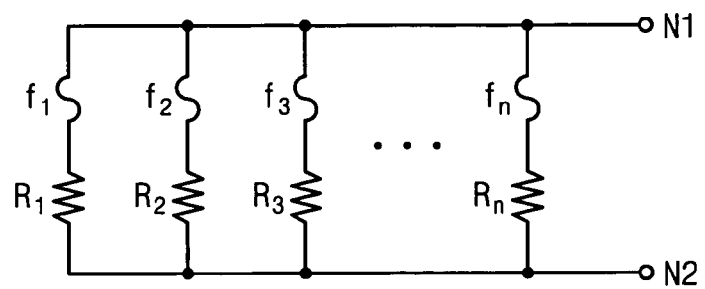
FIG. 7 is a circuit diagram illustrating a preferred embodiment of a fusing resistor part shown in FIG. 6.

FIG. 7 is a circuit diagram illustrating a preferred embodiment of the fusing resistor part 135 shown in FIG. 6. As described above with reference to FIG. 6, the first bias voltage Vbias1 is controlled by changing the value of the fusing resistor part 135 included in the bias circuit 130. Referring to FIG. 7, the fusing resistor part 135 is connected between two nodes N1 and N2. A plurality of resistors R1 to Rn connected in parallel between the nodes N1 and N2 are connected to fuses f1 to fn, respectively. The respective fuses f1 to fn adjust a resistance of the resistors R1 to Rn so that the bias circuit 130 can output a desired first bias voltage Vbias1.

Figure 8:
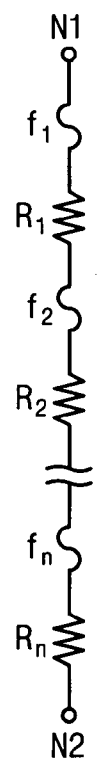
FIG. 8 is a circuit diagram illustrating another preferred embodiment of the fusing resistor part shown in FIG. 6.

FIG. 8 is a circuit diagram illustrating another preferred embodiment of the fusing resistor part 135 shown in FIG. 6. Referring to FIG. 8, fuses f1 to fn and resistors R1 to Rn are connected in series between two nodes N1 and N2. The respective fuses f1 to fn adjust a resistance of the resistors R1 to Rn so that the bias circuit 130 can output a desired first bias voltage Vbias1.

The fusing resistor part 135 may be configured with a combination of the parallel structure of FIG. 7 and the series structure of FIG. 8.

If the slew rate distribution of the output buffers 121 to 12n illustrated in FIG. 2 falls outside the required SR range SR1-SR2, the characteristic analyzing apparatus sets a first bias voltage Vbias1 that will be applied from the bias circuit 130 to the output buffers 121 to 12n so that the slew rate distribution of the output buffers 121 to 12n will fall within the required SR range SR1-SR2. To output the set bias voltage Vbias1, the value of the fusing resistor part 135 of the bias circuit 130 is adjusted. The desired value of the fusing resistor part 135 is set by cutting specific fuses f1 to fn by using a fusing apparatus (not shown). The cutting of the specific fuses f1 to fn can be implemented by a laser or an overcurrent supply.

According to a preferred embodiment of the present invention, the slew rates of the output buffers of the source driver are dispersed within a predetermined range by controlling the bias voltage, thereby preventing the degradation in the image quality of a display device.

A preferred embodiment of the present invention can be applied to at least one of an electrochromic display (ECD), a digital mirror device (DMD), an actuated mirror device (AMD), a grating light valve (GLV), a plasma display panel (PDP), an electro luminescent display (ELD), a light emitting diode (LED) display, and a vacuum fluorescent display (VFD), etc. In addition, the LCD to which a preferred embodiment of the present invention is applied can be applied to a large screen TV, a high definition television (HDTV), a portable computer, a camcorder, a vehicle display, information communication multimedia, and a virtual reality (VR) field, etc.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A source driver of a liquid crystal display (LCD), comprising:
   a plurality of output buffers for driving data lines; and
   a bias circuit for varying a bias voltage inputted to the output buffers to control a slew rate of the output buffers to fall within a predetermined range,
   wherein the bias circuit comprises a fusing resistor part including at least one resistor and fuse, the fusing resistor part determining a reference current of the bias circuit and controlling the bias voltage according to the reference current; and
   wherein each of the output buffers comprises:
   a bias current source for receiving the bias voltage to output a bias current;
   an input unit for receiving an analog image signal and a data line driving signal to output a differential current that is varied according to the bias current received by the input unit from the bias current source;
   an amplification output unit for generating the data line driving signal in response to the differential current; and
   a capacitor for stabilizing a frequency characteristic of the data line driving signal,
   wherein the bias circuit further comprises first and second transistors that have their gates connected to each other, a first terminal of each of the first and second transistors is connected to ground, the fusing resistor part is connected between a second terminal of the first transistor and a power supply voltage, and the bias voltage is output from a node between the power supply voltage and a second terminal of the second transistor.

2. The source driver of claim 1, wherein the slew rate is proportional to the bias current and inversely proportional to a capacitance of the capacitor.

3. The source driver of claim 2, wherein the bias voltage controls the bias current to adjust the slew rate.

4. The source driver of claim 1, wherein the resistance of the fusing resistor part is adjusted by cutting the at least one fuse by using a laser or an overcurrent supply.

5. The source driver of claim 4, wherein when the at least one resistor and fuse are connected in series with another resistor and fuse, and when at least one of the fuses is cut, the resistance of the fusing resistor part is decreased and the bias voltage is increased.

6. The source driver of claim 4, wherein when the at least one resistor and fuse are connected in parallel with another resistor and fuse, and when at least one of the fuses is cut, the resistance of the fusing resistor part is increased and the bias voltage is decreased.

7. The source driver of claim 4, wherein when the fusing resistor part includes the at least one resistor and fuse connected in series and another resistor and fuse connected in parallel, the resistance of the fusing resistor part is increased or decreased by cutting the parallel connected fuse or the series connected fuse to decrease or increase the bias voltage, respectively.

8. The source driver of claim 1, wherein the slew rate is adjusted before packaging the source driver in a chip.

9. The source driver of claim 1, wherein the slew rate of the output buffers falls within the predetermined range so that an image quality of the LCD is not degraded.

10. A method for controlling slew rates of output buffers for a source driver, the method comprising:
    determining a slew rate of the output buffers;
    determining whether the slew rate falls within a predetermined slew rate range; and
    when the slew rate falls outside the predetermined slew rate range, adjusting a bias voltage applied to the output buffers so that the slew rate falls within the predetermined slew rate range,
    wherein a bias circuit controls the slew rate of the output buffers to fall within the predetermined slew rate range,
    wherein the bias circuit comprises a fusing resistor part including at least one resistor and fuse, the fusing resistor part determining a reference current of the bias circuit and controlling the bias voltage according to the reference current; and
    wherein each of the output buffers comprises:
    a bias current source for receiving the bias voltage to output a bias current;
    an input unit for receiving an analog image signal and a data line driving signal to output a differential current that is varied according to the bias current received by the input unit from the bias current source;
    an amplification output unit for generating the data line driving signal in response to the differential current; and
    a capacitor for stabilizing a frequency characteristic of the data line driving signal,
    wherein the bias circuit further comprises first and second transistors that have their gates connected to each other, a first terminal of each of the first and second transistors is connected to ground, the fusing resistor part is connected between a second terminal of the first transistor and a power supply voltage, and the bias voltage is output from a node between the power supply voltage and a second terminal of the second transistor.

11. The method of claim 10, wherein the slew rate is proportional to the bias current and inversely proportional to a capacitance of the capacitor in the output buffers.

12. The method of claim 11, wherein the bias voltage controls the slew rate by increasing or decreasing the bias current.

13. The method of claim 10, wherein when the slew rate of the output buffers falls within the predetermined slew rate range an image quality of a liquid crystal display (LCD) including the source driver is not degraded.

14. The method of claim 10, wherein the bias voltage is adjusted by increasing or decreasing a resistance of the fusing resistor part.

15. The method of claim 14, wherein the resistance is increased or decreased by cutting one or more fuses in the fusing resistor part.

16. A source driver of a liquid crystal display (LCD), comprising:
    a plurality of output buffers for outputting voltages to drive data lines of the LCD; and
    a bias circuit for supplying a variable bias voltage to the output buffers so that the output buffers have a constant slew rate range and wherein the constant slew rate range falls within a predetermined range, wherein each of the output buffers comprises:

a bias current source including a fifth PMOS transistor for receiving the bias voltage and supplying a bias current to first and second PMOS transistors;

an input unit including the first and second PMOS transistors for respectively receiving first and second input signals for outputting a variable current corresponding to the bias current;

an amplification output unit including third, fourth, sixth and seventh PMOS transistors forming a current mirror, first and second NMOS transistors forming a cascade amplifying terminal and third and fourth NMOS transistors forming a current source, the amplification output unit receiving the variable current and outputting the output voltage, wherein the output voltage is fed back to the input unit as the second input signal; and a capacitor for stabilizing a frequency characteristic of the output voltage, wherein the bias circuit further comprises fifth and sixth NMOS transistors that have their gates connected to each other, a first terminal of each of the fifth and sixth NMOS transistors is connected to ground, a fusing resistor part is connected between a second terminal of the fifth NMOS transistor and a power supply voltage, and the bias voltage is output from a node between the power supply voltage and a second terminal of the sixth NMOS transistor.

17. The source driver of claim 16, wherein the fifth and sixth NMOS transistors form a current mirror.

18. The source driver of claim 17, wherein the bias voltage is varied by the fusing resistor part.

19. A source driver of a liquid crystal display (LCD), comprising:

a plurality of output buffers for driving data lines; and a bias circuit for varying a bias voltage inputted to the output buffers to control a slew rate of the output buffers, wherein each of the output buffers comprises:

a bias current source for receiving the bias voltage to output a bias current;

an input unit for receiving an analog image signal and a data line driving signal to output a differential current that is varied according to the bias current received by the input unit from the bias current source;

an amplification output unit for generating a data line driving signal in response to the differential current; and a capacitor for stabilizing a frequency characteristic of the data line driving signal, wherein the bias circuit comprises first and second transistors that have their gates connected to each other, a first terminal of each of the first and second transistors is connected to ground, a fusing resistor part is connected between a second terminal of the first transistor and a power supply voltage, and the bias voltage is output from a node between the power supply voltage and a second terminal of the second transistor.

* * * * *